United States Patent
Tian

(10) Patent No.: US 12,494,387 B2
(45) Date of Patent: Dec. 9, 2025

(54) HEATING DEVICE AND SEMICONDUCTOR PROCESSING APPARATUS

(71) Applicant: BEIJING NAURA MICROELECTRONICS EQUIPMENT CO., LTD., Beijing (CN)

(72) Inventor: Xiqiang Tian, Beijing (CN)

(73) Assignee: BEIJING NAURA MICROELECTRONICS EQUIPMENT CO., LTD., Beijing (CN)

( * ) Notice: Subject to any disclaimer, the term of this patent is extended or adjusted under 35 U.S.C. 154(b) by 491 days.

(21) Appl. No.: 17/999,914

(22) PCT Filed: May 26, 2021

(86) PCT No.: PCT/CN2021/095934
§ 371 (c)(1),
(2) Date: Nov. 25, 2022

(87) PCT Pub. No.: WO2021/238955
PCT Pub. Date: Dec. 2, 2021

(65) Prior Publication Data
US 2023/0230858 A1 Jul. 20, 2023

(30) Foreign Application Priority Data
May 26, 2020 (CN) .......................... 202010454487.6

(51) Int. Cl.
*H01L 21/67* (2006.01)
*C23C 16/455* (2006.01)
(Continued)

(52) U.S. Cl.
CPC .. *H01L 21/67103* (2013.01); *C23C 16/45561* (2013.01); *C23C 16/4586* (2013.01);
(Continued)

(58) Field of Classification Search
CPC ......... H01L 21/67103; H01L 21/28512; H01L 21/68785; H01L 21/67109;
(Continued)

(56) References Cited

U.S. PATENT DOCUMENTS

| | | | |
|---|---|---|---|
| 6,733,593 B1 * | 5/2004 | Tanaka | .................... C23C 16/04 118/724 |
| 2002/0050246 A1 | 5/2002 | Parkhe | |

(Continued)

FOREIGN PATENT DOCUMENTS

| | | |
|---|---|---|
| CN | 1973356 A | 5/2007 |
| CN | 101093811 A | 12/2007 |

(Continued)

OTHER PUBLICATIONS

Machine Translation CN 104377155 (Year: 2015).*
(Continued)

*Primary Examiner* — Rodney G McDonald
(74) *Attorney, Agent, or Firm* — ANOVA LAW GROUP, PLLC

(57) ABSTRACT

A heating device includes a heating assembly. The heating assembly includes a ventilation structure configured to blow gas to an edge of a to-be-processed workpiece carried by the heating device. The heating device further includes a base arranged on a side of the heating assembly away from a heating surface of the heating assembly. A mounting space is formed between the base and the heating assembly. The heating device also includes a cooling mechanism arranged in the mounting space, located at a position corresponding to an edge area of the heating surface, and configured to cool the heating assembly.

20 Claims, 4 Drawing Sheets

(51) Int. Cl.
  *C23C 16/458* (2006.01)
  *H01J 37/32* (2006.01)
  *H01L 21/285* (2006.01)
(52) U.S. Cl.
  CPC .. *H01J 37/32522* (2013.01); *H01J 37/32724* (2013.01); *H01L 21/28512* (2013.01)
(58) Field of Classification Search
  CPC ......... H01L 21/68792; C23C 16/45561; C23C 16/4586; C23C 16/466; C23C 16/4581; H01J 37/32522; H01J 37/32724
  USPC .................................................. 118/724, 725
  See application file for complete search history.

(56) References Cited

U.S. PATENT DOCUMENTS

| | | | |
|---|---|---|---|
| 2007/0258186 A1* | 11/2007 | Matyushkin | H01L 21/6875 361/234 |
| 2010/0020463 A1 | 1/2010 | Nasman et al. | |
| 2010/0039747 A1 | 2/2010 | Sansoni et al. | |
| 2013/0088809 A1 | 4/2013 | Parkhe et al. | |
| 2015/0370245 A1 | 12/2015 | Sugishita et al. | |
| 2018/0190528 A1 | 7/2018 | Parkhe | |

FOREIGN PATENT DOCUMENTS

| | | | | |
|---|---|---|---|---|
| CN | 103794538 A | * | 5/2014 | ....... H01L 21/67103 |
| CN | 104377155 A | * | 2/2015 | ........ H01J 37/32798 |
| CN | 110753995 A | | 2/2020 | |
| CN | 111607785 A | | 9/2020 | |
| CN | 112466809 A | | 3/2021 | |
| CN | 110931388 B | | 9/2023 | |
| IN | 101231941 A | | 7/2008 | |
| IN | 105489527 A | | 4/2016 | |
| JP | 2014150104 A | | 8/2014 | |
| JP | 2014522103 A | | 8/2014 | |
| JP | 2020047863 A | | 3/2020 | |
| KR | 20140045806 A | | 4/2014 | |
| KR | 101937692 B1 | | 1/2019 | |
| WO | 2014086283 A1 | | 6/2014 | |

OTHER PUBLICATIONS

Machine Translation CN 103794538 (Year: 2014).*
The World Intellectual Property Organization (WIPO) International Search Report for PCT/CN2021/095934 Aug. 27, 2021 6 Pages (including translation).

* cited by examiner

HEATING DEVICE AND SEMICONDUCTOR PROCESSING APPARATUS

CROSS-REFERENCE TO RELATED APPLICATIONS

This application is a national phase entry under 35 U.S.C. § 371 of International Application No. PCT/CN2021/095934, filed on May 26, 2021, which claims priority to Chinese Application No. 202010454487.6 filed on May 26, 2020, the entire contents of both of which are incorporated herein by reference.

TECHNICAL FIELD

The present disclosure generally relates to the semiconductor manufacturing technology field and, more particularly, to a heating device and a semiconductor processing apparatus.

BACKGROUND

Chemical vapor deposition (hereinafter referred to as CVD) process is a technology that uses various energy sources such as heating or plasma to cause chemical reactions between experiment materials or cause the experiment material to chemically react with corresponding gas in a reactor in a chemical reaction manner to form another gaseous compound. Then, the gaseous compound is transferred to a corresponding area with a different temperature than a reaction material source area for deposition to form a solid deposit in a physical carrier or chemical migration manner.

During the CVD process on a wafer 10, the wafer 10 is usually placed on a heater 20 as shown in FIG. 1. The heater 20 includes a heating plate 21. A vacuum suction hole is formed in a middle area of the heating plate 21. The vacuum suction hole is communicated with a vacuum pipeline 22. The wafer 10 can be adsorbed on the heating plate 21 through the vacuum suction hole. During a heating process on the wafer 10 by the heating plate 21, since pressure in a reaction chamber is generally higher than pressure in the vacuum pipeline 22, the pressure in an edge area between the wafer 10 and the heating plate 21 is relatively high, while the pressure in the middle area between the wafer 10 and the heating plate 21 is relatively low. Thus, in a certain period of time, the wafer has a higher temperature in the edge area and a lower temperature in the middle area of the wafer 10. Therefore, when the temperature in the edge area of the wafer 10 reaches a process temperature, the temperature in the middle area of the wafer 10 does not reach the process temperature. The temperature has a great impact on a film forming rate for the wafer 10. Normally, the higher the temperature is, the faster the film forming rate is. Thus, a film thickness at the edge area of the wafer 10 is greater than a film thickness in the middle area of the wafer 10, which causes the film thickness of different areas of the wafer 10 to be different. Thus, the uniformity of the film formation of the wafer 10 is poor.

SUMMARY

The present disclosure provides a heating device and a semiconductor processing apparatus, which can solve the problem of poor uniformity of the film formation of the wafer.

To solve the above problem, the present disclosure adopts the following technical solutions.

Embodiments of the present disclosure provide a heating device configured to carry and heat a to-be-processed workpiece in a semiconductor processing apparatus. The heating device includes a base, a heating assembly, and a cooling mechanism, wherein:

the heating assembly is provided with a first gas channel, an outlet of the first gas channel is located at an edge area of a heating surface of the heating assembly, an inlet of the first gas channel is located on a surface of the heating assembly away from a heating surface, the first gas channel is configured to blow gas to an edge of the to-be-processed workpiece;

the base is arranged on the side of the heating assembly away from the heating surface of the heating assembly, and a mounting space is formed between the base and the heating assembly, the cooling mechanism is arranged in the mounting space, located at a position corresponding to an edge area of the heating surface, and configured to cool the heating assembly.

In some embodiments, the cooling mechanism includes an annular assembly, at least one of a cooling water channel configured to transfer a cooling liquid or a cooling gas channel configured to transfer a cooling gas are integrated in the annular assembly, an outlet of the cooling gas channel faces a surface of the heating assembly away from the heating surface and configured to blow the cooling gas to the surface.

In some embodiments, the annular assembly is integrated with the cooling water channel configured to transfer the cooling liquid and the cooling gas channel configured to transfer the cooling gas. The annular assembly includes an annular body, a first annular cover, and a second annular cover. An annular groove is formed on a first surface of the annular body facing the surface of the heating assembly away from the heating surface. The first annular cover is sealed and connected to the annular body and forms the closed cooling water channel with the annular groove. A plurality of gas blow holes are arranged in the annular body. An outlet of each of the gas blow holes is located on the first surface. An inlet of each of the gas blow holes is located on a second surface of the annular body away from the first surface. The second annular cover is sealedly connected to the annular body on a side where the second surface of the annular body is located. The second annular cover and the annular body form a closed annular gas channel. The annular gas channel is connected to inlets of the gas blow holes.

In some embodiments, the plurality of gas blow holes are distributed on inner and outer sides of the cooling water channel, and gas blow holes on a same side are distributed along a circumferential direction of the annular body at intervals.

In some embodiments, a heating member is further integrated in the annular assembly, the heating member is configured to heat at least one of the cooling water channel or the cooling gas channel integrated in the annular assembly.

In some embodiments, the heating member includes a heating tube embedded in the annular assembly, and the heating tube is wounded around an axis of the annular assembly in a spiral plane shape.

In some embodiments, the cooling mechanism is in contact with the surface of the heating assembly away from the heating surface; or the cooling mechanism is arranged at an interval from the surface of the heating assembly away from the heating surface, and a heat conductive member that is in contact with the cooling mechanism and the surface of the heating assembly away from the heating surface is arranged between the cooling mechanism and the surface of the heating assembly away from the heating surface.

In some embodiments, the heating assembly includes a heating body, a gas channel plate arranged on the side of the heating body away from the heating surface, and a gas source channel. A second gas channel is formed between the gas channel plate and the heating body. The second gas channel is communicated with the inlet of the first gas channel. The second gas channel is communicated with the gas source channel.

In some embodiments, the second gas channel includes a first sub-channel and a second sub-channel. The first sub-channel is communicated with the first gas channel and the second sub-channel. The second sub-channel is communicated with the gas source channel. A gas storage volume of the second sub-channel and a gas storage volume of the first gas channel are both smaller than a gas storage volume of the first sub-channel. A flow rate of the second sub-channel is greater than a gas flow rate of the first gas channel.

In some embodiments, the first sub-channel is an annular channel. A plurality of second sub-channels are included. The plurality of second sub-channels are distributed along a circumferential direction of the annular channel at intervals. Each of the second sub-channels is a straight channel extending along a radial direction of the annular channel. An end of the straight channel is communicated with the annular channel, the other end of the straight channel is communicated with the gas source channel.

In some embodiments, the second gas channel is a groove formed on at least one of two opposite surfaces of the gas channel plate and the heating body.

In some embodiments, a surface of the base facing the gas channel plate is provided with a mounting groove. The mounting groove and the gas channel plate form the mounting space. The cooling mechanism is arranged at a groove bottom of the mounting groove. A high temperature resistant member is arranged between the cooling mechanism and the groove bottom.

In some embodiments, a support member is arranged in the mounting space, and the support member supports between the cooling mechanism and the groove bottom of the mounting groove.

In some embodiments, the heating assembly further includes an edge ring surrounding the heating body. The first gas channel includes a third sub-channel and a fourth sub-channel. The third sub-channel is arranged in the heating body. An outlet of the third sub-channel is located on an outer peripheral wall of the heating body, an inlet of the third sub-channel is located on the surface of the heating body away from the heating surface and communicated with the first sub-channel. An inner peripheral wall of the edge ring is arranged at an interval from the outer peripheral wall of the heating body to form the fourth sub-channel. The fourth sub-channel is communicated with the third sub-channel.

In some embodiments, a cooling channel configured to transfer a cooling medium is arranged in the edge ring.

Embodiments of the present disclosure provide a semiconductor processing apparatus, including a reaction chamber. The reaction chamber is provided with the above heating device.

The technical solutions adopted in the present disclosure can achieve the following beneficial effects.

In the heating device and semiconductor processing apparatus disclosed in embodiments of the present disclosure. A ventilation structure is provided in the heating assembly. The ventilation structure is configured to blow gas to the edge of the to-be-processed workpiece. The gas blown out may take away the heat at the edge of the to-be-processed workpiece. Further, the mounting space is formed between the base and the heating assembly. The cooling mechanism is arranged in the mounting space, located at the position corresponding to the edge area of the heating surface, and configured to cool the heating assembly. By arranging the cooling mechanism at the position corresponding to the edge area of the heating surface, the cooling mechanism can cool the edge area of the heating assembly. Thus, the heat-conducting gas between the to-be-processed workpiece and the heating assembly can be evenly distributed, which prevents the pressure of the heat conducting gas between the to-be-processed workpiece and the heating assembly from being large at the edge of the to-be-processed workpiece and from being small at the middle area of the to-be-processed workpiece. Further, by cooling the edge area of the heating assembly through the cooling mechanism, during the heating process of the to-be-processed workpiece, the temperature at the edge and the temperature at the middle area of the to-be-processed workpiece may be possibly caused to be the same, which prevents the temperature at the middle area of the to-be-processed workpiece from not reaching the process temperature when the temperature at the edge of the to-be-processed workpiece reaches the process temperature. Thus, the temperature distribution of the to-be-processed workpiece may be uniform, which avoids different thicknesses of the film formation at different areas of the same to-be-processed workpiece to further improve the uniformity of the film formation of the to-be-processed workpiece.

BRIEF DESCRIPTION OF THE DRAWINGS

In order to describe the technical solution of embodiments of the present disclosure or in the background technology more clearly, the following briefly introduces the accompanying drawings that are used in the description of embodiments or the background technology. Obviously, for those of ordinary skill in the art, other drawings can also be obtained according to these drawings without any creative effort.

DETAILED DESCRIPTION OF THE EMBODIMENTS

In order to make the objectives, technical solutions, and advantages of the present disclosure clearer, the technical solutions of the present disclosure are clearly and completely described below with reference to specific embodiments of the present disclosure and the corresponding drawings. Obviously, the described embodiments are only some, but not all, embodiments of the present disclosure. Based on embodiments of the present disclosure, all other embodiments obtained by those of ordinary skill in the art without creative efforts shall fall within the scope of the present disclosure.

The terms "first" and "second" in the specification and claims of the present disclosure are used to distinguish similar objects, and are not used to describe a specific order or sequence. It should be understood that data that is used so may be interchanged under an appropriate situation. Thus, embodiments of the present disclosure may be implemented in a sequence other than those illustrated or described herein. In addition, objects distinguished by "first" and "second" are usually one type, and a number of the objects is not limited. For example, a first object may be one or more. In addition, "and/or" in the specification and claims indicates at least one of the connected objects. The character "/" generally indicates that associated objects therebefore and thereafter are in an "or" relationship.

The technical solutions disclosed in embodiments of the present disclosure are described in detail below through specific embodiments and application scenarios with reference to the accompanying drawings.

Figure 1:
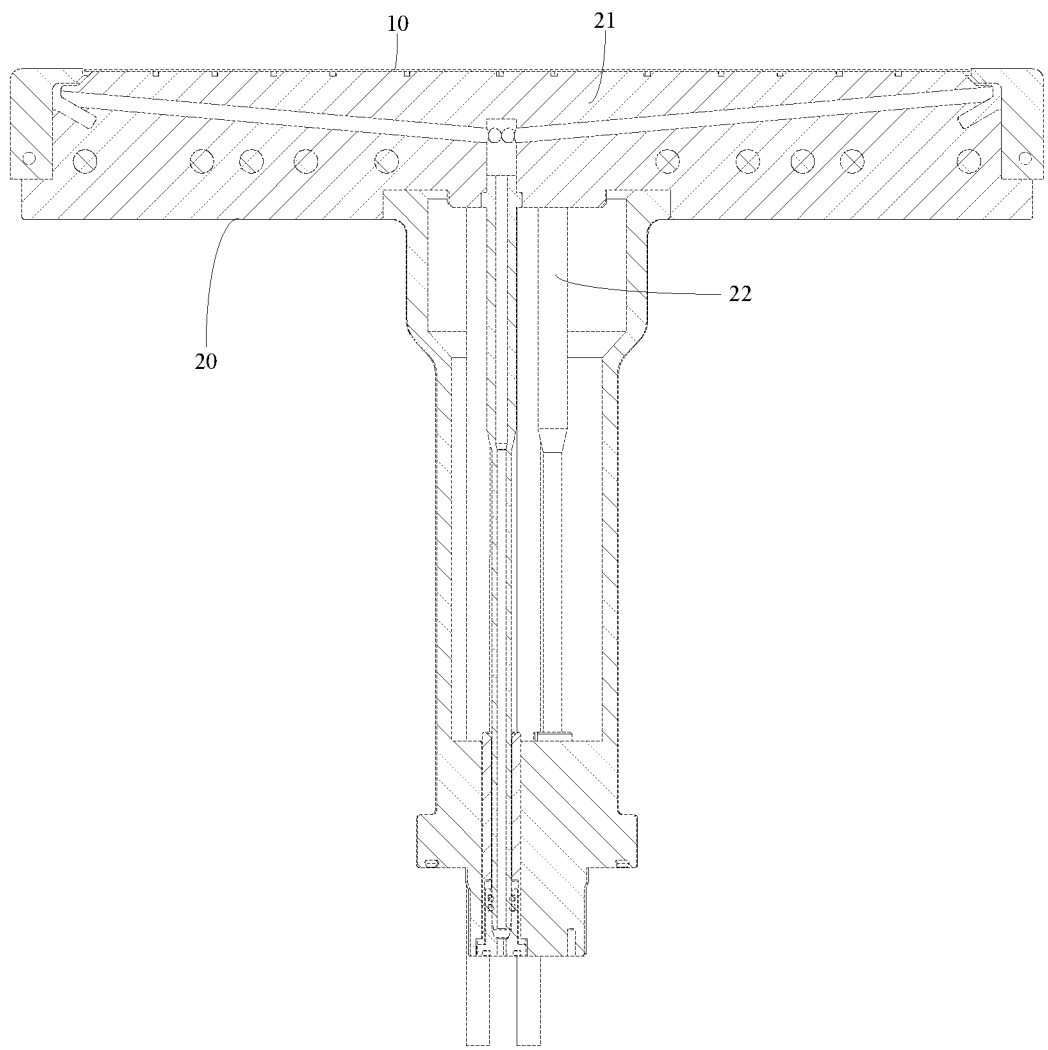
FIG. 1 is a schematic structural diagram of a typical heater in the existing technology.
Figure 2:
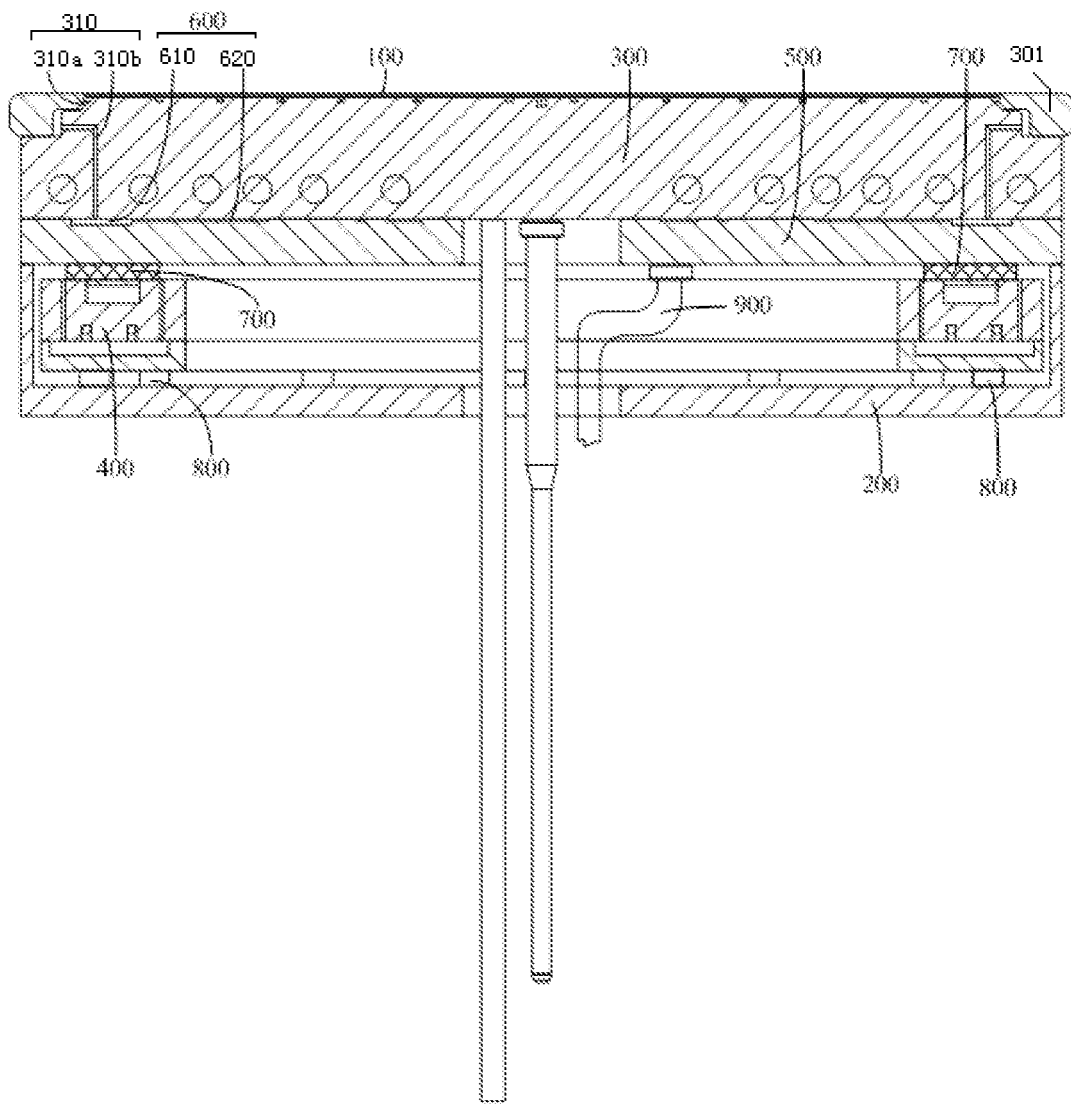
FIG. 2 is a schematic structural diagram of a heating device according to some embodiments of the present disclosure.
Figure 3:
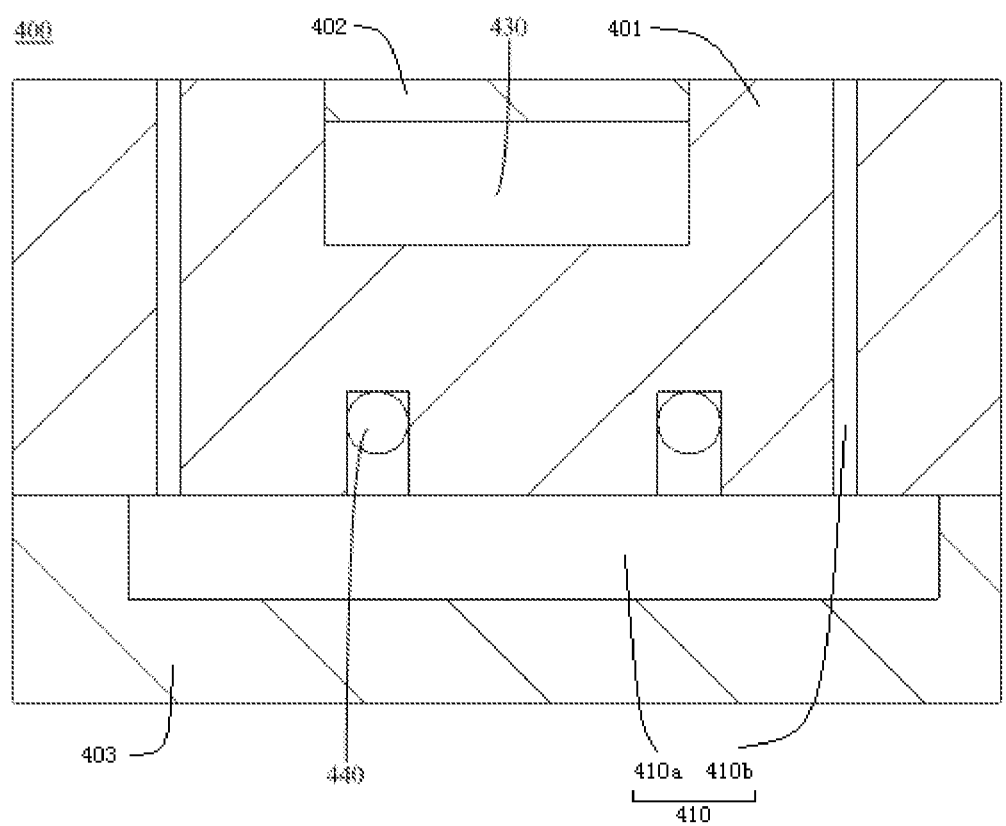
FIG. 3 is a schematic structural diagram of a cooling mechanism according to some embodiments of the present disclosure.
Figure 4:
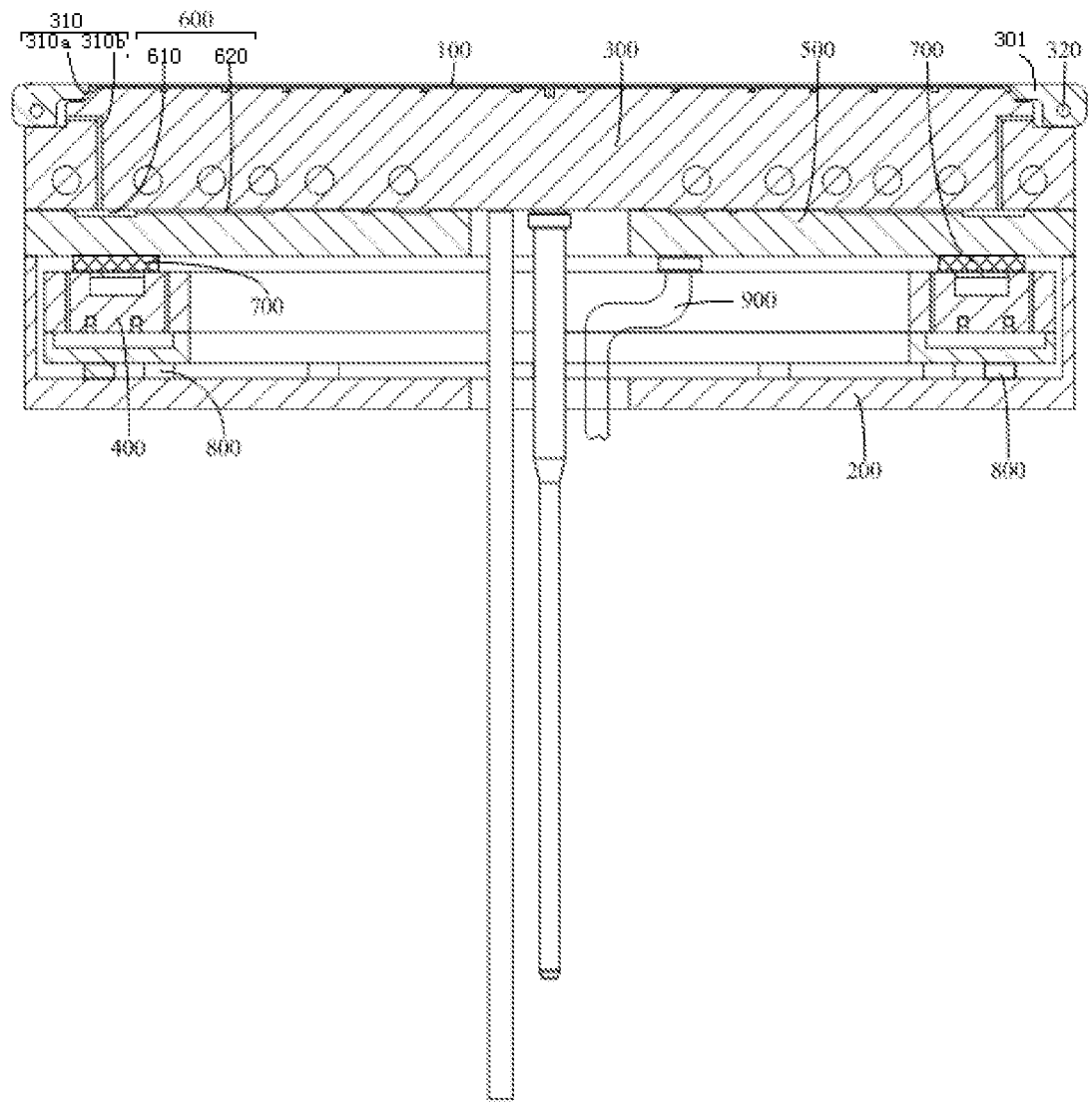
FIG. 4 is a schematic structural diagram of another heating device according to some embodiments of the present disclosure.

Refer to FIGS. 2 to 4, embodiments of the present disclosure provide a heating device. The disclosed heating device may be configured to carry and heat a to-be-processed workpiece 100 in a semiconductor processing apparatus. The to-be-processed workpiece 100 may generally be a wafer. Specifically, the semiconductor processing apparatus usually includes a reaction chamber. The heating device is arranged in the reaction chamber. During a wafer processing process, the wafer may be arranged on the heating device. The wafer may be heated by the heating device. When a process temperature is reached, a coating process of the wafer may be performed to realize the processing of the wafer.

The disclosed heating device includes a base 200, a heating assembly, and a cooling mechanism 400. The heating assembly includes a heating surface configured to carry the to-be-processed workpiece 100. A ventilation structure may be formed in the heating assembly. The ventilation structure may be configured to blow gas to an edge area of the to-be-processed workpiece 100. The heating assembly may have various structures. For example, in some embodiments, the heating assembly includes a heating body 300, a gas channel plate 500 arranged on a side of the heating body 300 away from the above heating surface, and a gas source channel 900 configured to be connected to a gas source (not shown in the figures). The heating body 300 may be in a disk shape and configured to carry and heat the to-be-processed workpiece 100. For example, a heating tube may be arranged in the heating body 300. The heating tube may generate heat and heat the heating body 300. Thus, the heat may be transferred to the to-be-processed workpiece 100 through the heating body 300.

The above ventilation structure includes, for example, a first gas channel 310 and a second gas channel 600. An outlet of the first gas channel 310 may be arranged at an edge area of the above heating surface of the heating body 300 (i.e., a surface of the heating body 300 facing upward in FIG. 2). An inlet of the first gas channel 310 may be arranged on a surface of the heating body 300 facing away from the above heating surface (i.e., a surface of the heating body 300 facing downward in FIG. 2). The first gas channel 310 may be configured to blow gas to the edge area of the to-be-processed workpiece 100. The second gas channel 600 may be arranged between the gas channel plate 500 and the heating body 300. The second gas channel 600 may be communicated with the inlet of the first gas channel 310. The second gas channel 600 may also be communicated with the above gas source channel. A gas provided by the gas source may flow to the edge area of the to-be-processed workpiece 100 through the above gas source channel 900, the second gas channel 600, and the first gas channel 310 in sequence.

By blowing the gas to the edge area of the to-be-processed workpiece 100 by the first gas channel 310, back plating or side plating of the to-be-processed workpiece 100 may be prevented, and the yield of the to-be-processed workpiece 100 may be improved.

In some embodiments, optionally, the above second gas channel 600 may be a groove on at least one of two opposite surfaces of the gas channel plate 500 and the heating body 300. The second gas channel 600 may be formed by connecting the gas channel plate 500 to the heating body 300. A formation manner of the second gas channel 600 is not limited in embodiments of the present disclosure.

In the heating device of embodiments of the present disclosure, the outlet of the first gas channel 310 may be arranged at the edge area of the heating surface of the heating body 300. Thus, the first gas channel 310 may be configured to blow gas to the edge area of the to-be-processed workpiece 100. The gas blown out may remove the heat at the edge area of the to-be-processed workpiece 100. Moreover, by arranging the first gas channel 310 at an outer edge area of the heating body 300, the gas may take away the heat of the outer edge area of the heating body 300 when the gas flows through the first gas channel 310. Thus, the gas in the first gas channel 310 may be used to cool the outer edge area of the heating body 300. Further, the gas blown out from the first gas channel 310 may also take away the heat of the edge area of the to-be-processed workpiece 100. Thus, the temperature distribution of the to-be-processed workpiece 100 may be more uniform.

In order to enable the gas to take more heat away from the outer edge area of the heating body 300 when flowing through the first gas channel 310, in an optional embodiment, the second gas channel 600 may include a first sub-channel 610 and a second sub-channel 620. The first sub-channel 610 may be communicated with the first gas channel 310 and the second sub-channel 620. The second sub-channel 620 may be communicated with the above gas source channel 900. The gas flowing out from the gas source channel 900 may flow into the first gas channel 310 through the second sub-channel 620 and the first sub-channel 610 in sequence.

In the above embodiment, a gas storage volume of the second sub-channel 620 and a gas storage volume of the first gas channel 310 may both be smaller than a gas storage volume of the first sub-channel 610. A flow rate of the second sub-channel 620 may be greater than a flow rate of the first gas channel 310. Thus, the gas may accumulate in the first sub-channel 610 to realize an effect of building up pressure to increase the gas flow rate in the first gas channel 310. The gas with a greater flow rate may take away more heat from the outer edge area of the heating body 300. Thus, the gas with the greater flow rate may better cool the outer edge area of the heating body 300 when flowing through the first gas channel 310. Further, when the gas with the greater flow rate is blown to the edge area of the to-be-processed workpiece 100, more heat may be taken away, causing the temperature distribution of the to-be-processed workpiece 100 to be more uniform. During the heating process of the to-be-processed workpiece 100, the heating body 300 may be configured to heat the to-be-processed workpiece 100 more uniformly. Thus, the temperature at the edge area and the temperature at the middle area of the to-be-processed workpiece 100 may become as same as possible, which may further avoid different thicknesses of the film formation at different areas on the same to-be-processed workpiece 100 to further improve the uniformity of the film formation of the to-be-processed workpiece 100.

In some embodiments, optionally, the first sub-channel 610 may be an annular channel. A plurality of second sub-channels 620 may be provided. The plurality of second sub-channels 620 may be arranged along a circumferential direction of the annular channel at intervals. Each second sub-channel 620 may be a straight channel extending in a radial direction of the annular channel. An end of the straight channel may be communicated with the annular channel. The other end of the straight channel may be communicated with the above gas source channel 900. Thus, the gas flowing out of the gas source channel 900 may flow uniformly to the above annular channel through the plurality of straight channels simultaneously to improve the uniformity of gas distribution.

As described above, the first sub-channel 610 and the second sub-channel 620 may have various formation manners. The formation manners of the first sub-channel 610 and the second sub-channel 620 are not limited in embodiments of the present disclosure. Specifically, the above annular channel (i.e., the first sub-channel 610) and the plurality of straight channels (i.e., the second sub-channel 620) may be an annular groove and a plurality of connection grooves, respectively, formed on at least one of the two opposite surfaces of the gas channel plate 500 and the heating body 300. Compared to a manner of forming openings to form the first sub-channel 610 and the second sub-channel 620, a manner of forming the annular groove and the connection grooves at the at least one of the gas channel plate 500 or the heating body 300 may be more beneficial for manufacturing with fewer processes and simpler processing. Thus, the processing difficulty of the gas channel plate 500 and/or the heating body 300 may be reduced, and the cost in the processing process may also be reduced.

In some embodiments, optionally, the heating assembly further includes an edge ring 301 around the surrounding of the heating body 300. The above first gas channel 310 may include a third sub-channel 310*b* and a fourth sub-channel 310*a*. The third sub-channel 310*b* may be arranged in the heating body 300. An outlet of the third sub-channel 310*b* may be arranged at an outer peripheral wall of the heating body 300. An inlet of the third sub-channel 310*b* may be arranged on the surface of the heating body 300 away from the above heating surface and communicated with the above first sub-channel 610. The fourth sub-channel 310*a* may be formed by arranging an inner peripheral wall of the edge ring 301 with the outer peripheral wall of the heating body 300 at an interval. The fourth sub-channel 310*a* and the third sub-channel 310*b* may be communicated with each other. Optionally, a groove may be formed in one of the inner peripheral wall of the edge ring 301 and the outer peripheral wall of the heating body 300. The fourth sub-channel 310*a* may be formed after the edge ring 301 and the heating body 300 are connected. A formation manner of the fourth sub-channel 310*a* is not limited in embodiments of the present disclosure. Other structures and functions of the edge ring 301 and the heating body 300 are all known technologies, which are not repeated here for brevity.

In an optional embodiment, as shown in FIG. 4, a cooling channel 320 configured to transfer a cooling medium is arranged in the edge ring 301. The cooling medium may be, for example, a cooling gas or cooling water. The cooling gas or cooling water in the cooling channel 320 may take away the heat at the edge of the heating body 300. Thus, the temperature at the edge of the heating body 300 may be low. During heating the to-be-processed workpiece 100 by the heating device, a heat-conducting gas between the to-be-processed workpiece 100 and the heating body 300 can be evenly distributed, which prevents the pressure of the heat-conducting gas between the to-be-processed workpiece 100 and the heating body 300 from being large at the edge of the to-be-processed workpiece 100 and being low at the middle area of the to-be-processed workpiece 100. Thus, the to-be-processed workpiece 100 may be uniformly heated by the heating body 300 to cause the temperature at the edge and the temperature at the middle area of the to-be-processed workpiece 100 to become as same as possible. Thus, the temperature distribution of the to-be-processed workpiece 100 is uniform, which avoids different thicknesses of the film formation at different areas of the same to-be-processed workpiece 100. Therefore, the uniformity of the film formation of the to-be-processed workpiece 100 may be good.

Further, the cooling channel 320 may be an annular water channel. The annular water channel may surround the heating body 300. Thus, more heat at the edge of the heating body 300 may be taken away by the cooling gas or cooling water in the cooling channel 320, which further improves the cooling effect of the cooling channel 320 on the edge of the heating body 300 to further improve the uniformity of the film formation of different areas of the to-be-processed workpiece 100.

The base 200 may be a basic member of the heating device. The base 200 may provide a mounting basis for other members of the heating device. Specifically, the base 200 may be arranged on a side of the heating assembly away from the heating surface. A mounting space may be formed between the base 200 and the above heating assembly. The cooling mechanism 400 may be arranged in the mounting space, be located at a position corresponding to the edge area of the heating surface, and be configured to cool the heating assembly.

By arranging the cooling mechanism 400 at a position corresponding to the edge area of the heating surface, the cooling mechanism 400 may cool the edge area of the heating assembly. Thus, the heat-conducting gas may be uniformly distributed between the to-be-processed workpiece 100 and the heating assembly, which prevents the pressure of the heating-conducting gas between the to-be-processed workpiece 100 and the heating assembly from being high at the edge of the to-be-processed workpiece 100 and low at the middle area of the to-be-processed workpiece 100. Further, by cooling the edge area of the heating assembly by the cooling mechanism 400, in the heating process of the to-be-processed workpiece 100, the temperature at the edge and the temperature at the middle area of the to-be-processed workpiece 100 may become as same as possible, which prevents the temperature at the middle area of the to-be-processed workpiece 100 from not reaching the process temperature when the temperature at the edge of the to-be-processed workpiece 100 reaches the process temperature. Thus, the temperature distribution of the to-be-processed workpiece 100 may be uniform, which avoids different thicknesses of the film formation at different areas of the to-be-processed workpiece 100 to further improve the uniformity of the film formation of the to-be-processed workpiece 100.

The cooling mechanism 400 may absorb heat during operation to cool the heating body 300. A plurality of gas channels may be formed at the gas channel plate 500. Some of the gas channels may be configured to blow gas to the edge of the to-be-processed workpiece 100 to prevent the back plating or side plating from occurring at the to-be-processed workpiece 100 to improve the yield of the to-beprocessed workpiece 100. Some of the gas channels may be configured to form negative pressure in the heating device. Thus, the heating device may adsorb the to-be-processed workpiece 100.

In some embodiments, optionally, the above cooling mechanism 400 may be an annular assembly. As shown in FIG. 3, the annular assembly is integrated with at least one of a cooling water channel 430 configured to transfer a cooling liquid or a cooling gas channel 410 configured to transfer the cooling gas. An outlet of the cooling gas channel 410 may face a surface of the above heating assembly away from the heating surface and configured to blow the cooling gas to the surface. Since the cooling mechanism 400 uses the annular assembly, which corresponds to the edge area of the heating surface and cools the edge area of the heating assembly. An area of the annular assembly facing the outer edge area of the gas channel plate 500 may be large. Thus, the annular assembly may take away the heat of the outer edge area of the gas channel plate 500 faster. Thus, the cooling mechanism 400 may better cool the heating body 300 to cause the thickness of the film formation at different areas of the to-be-processed workpiece 100 to become as same as possible.

The above annular assembly may have a plurality of structures. For example, as shown in FIG. 3, the annular assembly is integrated with the cooling water channel 430 configured to transfer the cooling liquid and the cooling gas channel 410 configured to transfer the cooling gas. Moreover, the annular assembly includes an annular body 401, a first annular cover plate 402, and a second annular cover plate 403. An annular groove may be formed on a first surface (i.e., a surface of the annular body 401 facing upward) of the annular body 401 corresponding to the surface of the heating assembly away from the heating surface. The first cover plate 402 may be sealed and connected to the annular body 401 and form a closed cooling water channel 430 with the annular groove. The cooling water may be introduced into the cooling water channel 430. During a specific cooling process, the cooling water in the cooling water channel 430 may take away the heat conducted from the outer edge area of the gas channel plate 500 to the cooling mechanism 400. Thus, the cooling mechanism 400 may take away the heat from the outer edge area of the gas channel plate 500. Thus, the effect of cooling the outer edge area of the gas channel plate 500 may be realized to further realize the effect of cooling the edge of the heating body 300. Compared to the gas cooling manner, the water cooling manner may have a better effect. Thus, the cooling mechanism 400 may better cool the outer edge area of the gas channel plate 500. Thus, the temperature distribution of the to-be-processed workpiece 100 may be more uniform to cause the uniformity of the film formation of the to-be-processed workpiece 100 to be better.

Moreover, as shown in FIG. 3, a plurality of gas blow holes 410b are arranged in the annular body 401. An outlet of each gas blow hole 410b is arranged on the first surface of the annular body 401. An inlet of each gas blow hole 410b may be arranged on a second surface (the surface of the annular body 401 facing downward) of the annular body 401 away from the first surface. The second annular cover plate 403 may be sealed and connected to the annular body 401 on a side of the second surface of the annular body 401. The second annular cover plate 403 and the annular body 401 may form a closed annular gas channel 410a and may be configured to communicate the annular gas channel 410a with the gas blow holes 410b. The cooling gas may flow to the gas blow holes 410b through the annular gas channel 410a in sequence and may be blown to the outer edge area of the gas channel plate 500 through the outlet of the gas blow hole 410b. Thus, the cooling gas may take away the heat of the outer edge area of the gas channel plate 500 to realize the effect of cooling the outer edge area of the gas channel plate 500. This arrangement manner may be simple and reliable, which facilitates a designer to design the cooling mechanism 400 to reduce the design difficulty of the cooling mechanism 400. Further, after being blown out, the cooling gas may be hard to impact the processing of the to-be-processed workpiece 100. Moreover, the cooling gas may be difficult to affect the environment and has a low cost.

In some optional embodiments, in order to improve the cooling uniformity in the circumferential direction of the annular body 401, the above plurality of gas blow holes 410b may be distributed on inner and outer sides of the cooling water channel 430. Gas blow holes 410b on a same side may be distributed along the circumferential direction of the annular body 401 at intervals.

It needs to be noted that, in some embodiments, the cooling water channel 430 and the cooling gas channel 410 may be integrated in the annular assembly. The outer edge area of the gas channel plate 500 may be cooled by the cooling gas, and the outer edge area of the gas channel plate 500 may be cooled by the cooling water. Further, the cooling water in the cooling water channel 430 may be also used to cool the cooling gas in the cooling gas channel 410. Thus, the cooling effect of the cooling mechanism 400 may be better on the outer edge area of the gas channel plate 500. Therefore, the cooling mechanism 400 may further cool the edge of the cooling body 300 to cause the temperature distribution of the to-be-processed workpiece 100 to be more uniform. Of course, in practical applications, according to specific needs, only one of the cooling water channel 430 and the cooling gas channel 410 may need to be provided.

During the process of cooling the edge of the heating body 300 by the cooling mechanism 400, the edge of the heating body 300 may be over-cooled by the cooling mechanism 400 because the temperature of the cooling gas or cooling water may be too low. Thus, the temperature at the edge of the to-be-processed workpiece 100 may be low, the temperature at the middle area of the to-be-processed workpiece 100 may be high, and the temperature distribution of the to-be-processed workpiece 100 may not be uniform, which further causes different thicknesses of the film formation at different areas of the same to-be-processed workpiece 100. Based on this, in an optional embodiment, a heating member 440 may be further integrated in the annular assembly. The heating assembly 440 may be configured to heat at least one of the cooling water channel 430 or the cooling gas channel 410 integrated in the annular assembly. Thus, the over cooling of the edge of the heating body 300 by the cooling mechanism 400 due to the too low temperature of the cooling gas may be prevented. Thus, the temperature distribution of the to-be-processed workpiece 100 may be uniform, which avoids that the temperature at the edge of the to-be-processed workpiece 100 is too low, and the temperature at the middle area of the to-be-processed workpiece 100 is high. Therefore, the thicknesses of the film formation at different areas of the same to-be-processed workpiece 100 may become as same as possible.

Of course, the heating member 440 may also be configured to heat the cooling water in the cooling water channel 430 to prevent the cooling mechanism 400 from over-cooling the edge of the heating body 300 because the temperature of the cooling water is too low. Similarly, the temperature distribution of the to-be-processed workpiece 100 may be relatively uniform in embodiments of the present disclosure, which avoids that the temperature at the edge of the to-be-processed workpiece 100 is low, and the temperature at the middle area of the to-be-processed workpiece 100 is high. Thus, the thicknesses at different areas of the same to-be-processed workpiece 100 may become as same as possible.

The above heating member 440 may have a plurality of structures. For example, the heating member 440 may be a heating pipe embedded in the above annular assembly (e.g., the annular body 401). The heating pipe may be wound in a spiral plane around an axis of the annular assembly. Thus, the heating uniformity in the circumferential direction of the annular body 401 may be ensured.

In embodiments of the present disclosure, the cooling mechanism 400 may be in contact with the surface of the above heating assembly away from the heating surface. For example, the above annular assembly may be in contact with the outer edge area of the gas channel plate 500. Thus, the cooling mechanism 400 may be directly connected to the outer edge area of the gas channel plate 500. The cooling mechanism 400 may absorb the heat of the edge of the heating body 300 through the outer edge area of the gas channel plate 500. Thus, the cooling mechanism 400 may cool the edge of the heating body 300. During the heating process of the to-be-processed workpiece 100, the heating body 300 may heat the to-be-processed workpiece 100 uniformly to cause the temperature distribution of the to-be-processed workpiece 100 to be uniform.

Alternatively, the cooling mechanism 400 may also be arranged at an interval from the surface of the heating assembly facing away from the heating surface. A heat conduction member 700 that contacts the cooling mechanism 400 and the surface of the heating member away from the heating surface may be arranged between the cooling mechanism 400 and the surface of the heating member away from the heating surface. For example, the above annular assembly may face the outer edge area of the gas channel plate 500. That is, the above annular assembly may have a distance from the outer edge area of the gas channel plate 500. The heat conduction member 700 may be arranged between the above annular assembly and the outer edge area of the gas channel plate 500. The heat conduction member 700 may be configured to transfer the heat of the outer edge area of the gas channel plate 500 to the above annular assembly. Thus, the above annular assembly may take away the heat of the outer edge area of the gas channel plate 500 and cool the edge of the heating body 300. With the above two heat conduction connection manners, the cooling mechanism 400 may better cool the edge of the heating body 300 to cause the temperature distribution of the to-be-processed workpiece 100 to be more uniform. The heat conduction member 700 may include a copper plate, stainless steel fins, copper fins, thermally conductive adhesive, and thermally conductive foam.

As described above, the mounting space may be formed between the base 200 and the heating assembly (e.g., the gas channel plate 500). The cooling mechanism 400 may be arranged in the mounting space. Specifically, the mounting groove may be formed on the surface of the base 200 facing gas channel plate 500. After the base 200 is connected to the gas channel plate 500, the mounting groove may form the mounting space with the gas channel plate 500. The cooling mechanism 400 may be arranged at a groove bottom of the mounting groove. Thus, the cooling mechanism 400 may be arranged in the mounting space. A high temperature-resistant member may be arranged between the cooling mechanism 400 and the groove bottom to prevent the heat of the heating body 300 from being transferred to the base 200. Further, with the high temperature-resistant member, the cooling mechanism 400 may be stably arranged at the groove bottom of the mounting groove, which avoids a failure of a connection relationship between the cooling mechanism 400 and the groove bottom due to a high temperature. In some embodiments, the manner for forming the mounting space may be simple, and the mounting manner of the cooling mechanism 400 may be simple and reliable, which facilitates a staff member to set up.

Further, a support member 800 may be arranged in the mounting space. The support member 800 may support between the cooling mechanism 400 and the groove bottom of the mounting groove to prevent a contact area between the cooling mechanism 400 and the groove bottom from being large to prevent the cooling mechanism 400 from absorbing the heat of the base 200. Thus, the cooling mechanism 400 may be ensured to better cool the heating body 300, which improves a cooling effect of the cooling mechanism 400 on the heating body 300.

In summary, in the heating device of embodiments of the present disclosure, the ventilation structure may be arranged in the heating assembly. The ventilation structure may be configured to blow gas to the edge of the to-be-processed workpiece. The gas blown out may take away the heat of the edge of the to-be-processed workpiece. Further, the mounting space may be formed between the base and the heating assembly. The cooling mechanism may be arranged in the mounting space, located at a position corresponding to the edge area of the heating surface, and configured to cool the heating assembly. By arranging the cooling mechanism at the position corresponding to the edge area of the heating surface, the cooling mechanism may cool the edge area of the heating assembly. Thus, the heat conducting gas between the to-be-processed workpiece and the heating assembly may be distributed uniformly, which prevents the pressure of the heat conducting gas between the to-be-processed workpiece and the heating assembly from being large at the edge of the to-be-processed workpiece and the pressure at the middle area of the to-be-processed workpiece from being small. Further, to cool the edge area of the heating assembly by the cooling mechanism, during the heating process of to-be-processed workpiece, the temperature at the edge and the temperature at the middle area of the to-be-processed workpiece may be caused to be as same as possible, which prevents the temperature at the middle area of the to-be-processed workpiece from not reaching the process temperature when the temperature at the edge of the to-be-processed workpiece reaches the process temperature. Thus, the temperature distribution of the to-be-processed workpiece may be uniform, which avoids different thicknesses of the film formation at different areas of the same to-be-processed workpiece to further improve the uniformity of the film formation of the to-be-processed workpiece.

Based on the heating device of embodiments of the present disclosure, embodiments of the present disclosure further provide a semiconductor processing apparatus. The disclosed semiconductor processing apparatus may include a reaction chamber. The heating device as described in the above embodiments may be arranged in the reaction chamber.

In the semiconductor processing apparatus disclosed in embodiments of the present disclosure, by using the heating device disclosed in embodiments of the present disclosure, during the heating process of the to-be-processed workpiece, the temperature at the edge and the temperature at the middle area of the to-be-processed workpiece may be possibly caused to be the same, which prevents the temperature at the middle area of the to-be-processed workpiece from not reaching the process temperature when the temperature at the edge of the to-be-processed workpiece reaches the process temperature. Thus, the temperature distribution of the to-be-processed workpiece may be uniform, which avoids different thicknesses of the film formation at different areas of the same to-be-processed workpiece to further improve the uniformity of the film formation of the to-be-processed workpiece.

The above embodiments of the present disclosure mainly describe the differences between the various embodiments. As long as different optimization features of the various embodiments are not contradictory, the optimization features may be combined to form better embodiments, which are not repeated here for brevity.

The above descriptions are merely embodiments of the present disclosure and are not intended to limit the present disclosure. Various modifications and variations may be made to the present disclosure for those skilled in the art. Any modifications, equivalent replacements, improvements made within the spirit and principle of the present disclosure shall be included within the scope of the claims of the present application.

What is claimed is:

1. A heating device comprising:
 a heating assembly including:
  a gas source channel configured to be connected to a gas source;
  a ventilation structure configured to blow gas to an edge of a to-be-processed workpiece carried by the heating device and including a first gas channel and a second gas channel, wherein:
   the second gas channel includes a first sub-channel communicated with the first gas channel and a second sub-channel communicated with the gas source channel and the first sub-channel; and
   a flow rate of the second sub-channel is greater than a gas flow rate of the first gas channel;
 a base arranged on a side of the heating assembly away from a heating surface of the heating assembly, a mounting space being formed between the base and the heating assembly; and
 a cooling mechanism arranged in the mounting space, located at a position corresponding to an edge area of the heating surface, and configured to cool the heating assembly.

2. The heating device according to claim 1, wherein the cooling mechanism includes an annular assembly formed with at least one of:
 a cooling water channel configured to transfer a cooling liquid; or
 a cooling gas channel configured to transfer a cooling gas, an outlet of the cooling gas channel facing an opposite surface of the heating assembly away from the heating surface, and the outlet of the cooling gas channel being configured to blow the cooling gas to the proximal surface.

3. The heating device according to claim 2, wherein:
 the annular assembly is formed with both the cooling water channel and the cooling gas channel; and
 the annular assembly includes:
  an annular body, an annular groove is formed on a first surface of the annular body facing the opposite surface of the heating assembly, a plurality of gas blow holes being arranged in the annular body, an outlet of each of the gas blow holes being arranged on the first surface, an inlet of each of the gas blow holes being arranged on a second surface of the annular body away from the first surface;
  a first annular cover sealedly connected to the annular body and forming the cooling water channel that is closed with the annular groove; and
  a second annular cover sealedly connected to the annular body on a side where the second surface of the annular body is located, the second annular cover and the annular body forming the annular gas channel that is closed, and the annular gas channel being connected to the inlets of the gas blow holes.

4. The heating device according to claim 3, wherein:
 the plurality of gas blow holes are distributed on inner and outer sides of the cooling water channel; and
 the gas blow holes on a same one of the inner and outer sides are distributed along a circumferential direction of the annular body at intervals.

5. The heating device according to claim 2, wherein the annular assembly further includes a heating member, the heating member being configured to heat the at least one of the cooling water channel or the cooling gas channel.

6. The heating device according to claim 5, wherein the heating member includes a heating tube embedded in the annular assembly, the heating tube being wound around an axis of the annular assembly in a spiral plane shape.

7. The heating device according to claim 1, wherein:
 the cooling mechanism is in contact with a surface of the heating assembly away from the heating surface; or
 the cooling mechanism is arranged at an interval from the surface of the heating assembly away from the heating surface, a heat conductive member that is in contact with the cooling mechanism and the surface of the heating assembly away from the heating surface being arranged between the cooling mechanism and the surface of the heating assembly away from the heating surface.

8. The heating device according to claim 1, wherein;
 the heating assembly includes:
  a heating body including the heating surface; and
  a gas channel plate arranged on a side of the heating body away from the heating surface;
  the first gas channel is configured to blow gas to the edge of the to-be-processed workpiece, an outlet of the first gas channel is located at the edge area of the heating surface of the heating body, and an inlet of the first gas channel is located on a surface of the heating body away from the heating surface; and
  the second gas channel is located between the gas channel plate and the heating body, and communicated with the inlet of the first gas channel and the gas source channel.

9. The heating device according to claim 8, wherein:
 a gas storage volume of the second sub-channel and a gas storage volume of the first gas channel are both smaller than a gas storage volume of the first sub-channel.

10. The heating device according to claim 9, wherein:
 the first sub-channel includes an annular channel;
 the second sub-channel is one of a plurality of second sub-channels distributed along a circumferential direction of the annular channel at intervals, each of the second sub-channels being a straight channel extending along a radial direction of the annular channel, an end of the straight channel being communicated with the annular channel, and another end of the straight channel being communicated with the gas source channel.

11. The heating device according to claim 9, wherein:
the heating assembly further includes an edge ring surrounding the heating body;
the first gas channel includes:
   a third sub-channel arranged in the heating body, an outlet of the third sub-channel being located on an outer peripheral wall of the heating body, and an inlet of the third sub-channel being located on the surface of the heating body away from the heating surface and communicated with the first sub-channel; and
   a fourth sub-channel communicated with the third sub-channel and formed between the outer peripheral wall of the heating body and an inner peripheral wall of the edge ring arranged at an interval from the outer peripheral wall of the heating body.

12. The heating device according to claim 11, wherein a cooling channel configured to transfer a cooling medium is arranged in the edge ring.

13. The heating device according to claim 8, wherein the second gas channel is a groove formed on at least one of a surface of the gas channel plate and a surface of the heating body that are opposite to each other.

14. The heating device according to claim 8, wherein:
a surface of the base opposite to the gas channel plate is provided with a mounting groove;
the mounting groove and the gas channel plate form the mounting space;
the cooling mechanism is arranged at a groove bottom of the mounting groove; and
a temperature-resistant member is arranged between the cooling mechanism and the groove bottom.

15. The heating device according to claim 14, wherein:
a support member is arranged in the mounting space; and
the support member supports between the cooling mechanism and the groove bottom of the mounting groove.

16. A semiconductor processing apparatus comprising:
a reaction chamber; and
a heating device provided in the reaction chamber and including:
   a heating assembly including:
      a gas source channel configured to be connected to a gas source;
      a ventilation structure configured to blow gas to an edge of a to-be-processed workpiece carried by the heating device and including a first gas channel and a second gas channel, wherein:
         the second gas channel includes a first sub-channel communicated with the first gas channel and a second sub-channel communicated with the gas source channel and the first sub-channel; and
         a flow rate of the second sub-channel is greater than a gas flow rate of the first gas channel;
   a base arranged on a side of the heating assembly away from a heating surface of the heating assembly, a mounting space being formed between the base and the heating assembly; and
   a cooling mechanism arranged in the mounting space, located at a position corresponding to an edge area of the heating surface, and configured to cool the heating assembly.

17. The semiconductor processing apparatus according to claim 16, wherein the cooling mechanism includes an annular assembly formed with at least one of:
   a cooling water channel configured to transfer a cooling liquid; or
   a cooling gas channel configured to transfer a cooling gas, an outlet of the cooling gas channel facing an opposite surface of the heating assembly away from the heating surface, and the outlet of the cooling gas channel being configured to blow the cooling gas to the proximal surface.

18. The semiconductor processing apparatus according to claim 17, wherein:
the annular assembly is formed with both the cooling water channel and the cooling gas channel; and
the annular assembly includes:
   an annular body, an annular groove is formed on a first surface of the annular body facing the opposite surface of the heating assembly, a plurality of gas blow holes being arranged in the annular body, an outlet of each of the gas blow holes being arranged on the first surface, an inlet of each of the gas blow holes being arranged on a second surface of the annular body away from the first surface;
   a first annular cover sealedly connected to the annular body and forming the cooling water channel that is closed with the annular groove; and
   a second annular cover sealedly connected to the annular body on a side where the second surface of the annular body is located, the second annular cover and the annular body forming the annular gas channel that is closed, and the annular gas channel being connected to the inlets of the gas blow holes.

19. The semiconductor processing apparatus according to claim 18, wherein:
the plurality of gas blow holes are distributed on inner and outer sides of the cooling water channel; and
the gas blow holes on a same one of the inner and outer sides are distributed along a circumferential direction of the annular body at intervals.

20. The semiconductor processing apparatus according to claim 17, wherein the annular assembly further includes a heating member, the heating member being configured to heat the at least one of the cooling water channel or the cooling gas channel.

* * * * *